United States Patent [19]

Oogaki

[11] Patent Number: 4,608,648
[45] Date of Patent: Aug. 26, 1986

[54] DATA DISPLAY SYSTEM
[75] Inventor: Kenji Oogaki, Hyogo, Japan
[73] Assignee: Mitsubishi Denki Kabushiki Kaisha, Tokyo, Japan
[21] Appl. No.: 598,062
[22] Filed: Apr. 9, 1984
[51] Int. Cl.$^4$ ............................................. G01R 31/08
[52] U.S. Cl. ................................................... 364/483
[58] Field of Search ... 364/200 MS File, 900 MS File, 364/483

[56] References Cited
U.S. PATENT DOCUMENTS

| | | | |
|---|---|---|---|
| 4,085,438 | 4/1978 | Butler | 364/300 |
| 4,133,039 | 1/1979 | Eichenlaub | 364/900 |
| 4,156,929 | 5/1979 | Eichenlaub | 364/900 |
| 4,189,765 | 2/1980 | Kotalik et al. | 364/900 |

Primary Examiner—Gareth D. Shaw
Assistant Examiner—John G. Mills
Attorney, Agent, or Firm—Bernard, Rothwell & Brown

[57] ABSTRACT

A data display system for displaying selectively on a data display computational data from a central processing unit (CPU) and data stored in a memory representing setting values used as criteria for the result of computation by the CPU. Setting values to be displayed are set on an operation device and, after being processed by the CPU, are sent to the memory. The stored data of setting values are selected by a selection switch and sent through a multiplexer to a data display device. A display selection switch means operates on gate means and the multiplexer to supply a numeric code set on the operation device corresponding to computational data to be displayed to the CPU through the gate means, so that computational data from the CPU is sent through the multiplexer to the data display device.

2 Claims, 5 Drawing Figures

DATA DISPLAY SYSTEM

BACKGROUND OF THE INVENTION

1. Field of the Invention

The present invention relates to a data display system for displaying data created in a digital system as a result of computation by a central processing unit and setting values stored in a memory for use as criteria of the computational result.

For explanatory purposes, the digital protective relay (will be termed simply digital relay hereinafter) to which the present invention is applied will be described.

2. Description of the Prior Art

The digital relay incorporates a central processing unit (will be termed simply CPU hereinafter) for processing information related to the power line system. In the process, the CPU compares data being processed with reference values called "setting values" stored in the memory and used to determine the occurrence of error or fault in the power line system, and, upon determination of a fault, sends a trip signal to a circuit breaker so as to remove the fault. In order to test the performance and characteristics of the digital relay, it is necessary to examine data processed in the digital relay, i.e., data as a result of computation by the CPU.

The following describes the case where a range relay is formed by the digital relay. The range relay is used for the removal of a fault on the power line, and one of the processing methods employed by the range relay is that the impedance of the power line up to the point of faulty is calculated directly from the voltage and current information on the power line and determination is made as to whether the calculated impedance resides within the setting value. In this method, the line voltage and current are sampled at the 90° interval of the electrical angle. The sampled voltage and current values are subjected to the following computations.

$$I^2 = I^2(t) + i(t - 90°) \quad (1)$$
$$VI \cos \theta = i(t - 90°) \cdot n(t - 90°) + i(t) \quad (2)$$
$$VI \sin \theta = i(t) \cdot n(t - 90°) - i(t - 90°) \cdot n(t) \quad (3)$$

Equations (1) and (2) give:

$$R = \frac{VI \cos\theta}{I^2} = \frac{V}{I} \cos\theta = Z \cos\theta \quad (4)$$

Equations (1) and (3 give:

$$X = \frac{VI \sin\theta}{I^2} = \frac{V}{I} \sin\theta = Z \sin\theta \quad (5)$$

Equations (4) and (5) provide the resistive component R and reactive component X of the impedance Z. FIG. 1 depicts the characteristics of the range relay in which the inside of the circle represents the operating region, while the outside of the circle represent the non-operating region. Upon occurrence of a fault on the power line, the impedance of the power line up to the point of fault is calculated from the voltage and current information sampled at that time. If the impedance is within a certain value, i.e., inside of the circle shown in FIG. 1, the range relay provides the operation signal. If the impedance is above the certain value, i.e., outside the circle, the range relay makes a decision of non-operation based on the fault being outside the protecting range of the range relay. Since the impedance of the power line up to the point of fault is proportional to the length of the line, the distance up to the point of fault can be determined from the impedance calculated by the digital relay. On this account, it is important meaning to read out data processed in the digital relay, i.e., data processed by the CPU and data transferred to/from the CPU.

Next, the above-mentioned data display operation by the conventional digital relay will be described. FIG. 2 is a block diagram of a digital relay using the conventional data display unit. The major constituents of the digital relay include a central processing unit (CPU) 1 which works as a brain of the digital relay, a memory 2 for storing programs for the CPU 1, input/output data and computational data, an analog input unit 3 for receiving the analog values of the voltage and current on the power line and converting the analog values into corresponding digital values, a digital output unit for transmitting the output of the digital relay, and a setting unit 5 for holding setting values which are criteria of the relay operation.

The system further includes a maintenance panel interface 6 located between the CPU 1 of the digital relay and a maintenance panel 7 and used for the maintenance activity. The maintenance panel 7 is used by the operator for the modification of programs stored in the memory 2 of the digital relay and for reading out computational data. The maintenance panel interface 6 and the maintenance panel 7 constitute a data display unit. The maintenance panel interface 6 consists of an address register 8, a data input register 9 and a data output register 11, while the maintenance panel 7 incorporates a digital display device 11 which displays data processed by the digital relay, i.e., computational data stored in the memory 2 for the CPU 1, and a data setting device 12 which is used for setting the address and data.

In the arrangement of FIG. 2, when it is requested that data processed in the digital relay be read out, e.g., the impedance of the power line up to the point of fault, the operator will take the following action. First, if the power system is operating normally, the maintenance panel interface 6 and maintenance panel 7 for displaying data are not necessary and they are not connected to the system. When a fault occurs in the power line system and the range relay made up of the digital relay is operated to evaluate the line impedance up to the point of fault, the maintenance panel interface 6 is connected to the bus of the CPU 1. The maintenance panel 7 is connected to the interface 6. The operator operates the data setting device 12 on the maintenance panel 7 to load the address register 8 in the interface 6 with the address of the memory 2 where the value of impedance calculated by the CPU 1 is stored. Then, an interrupt signal is issued to the CPU 1 from the maintenance panel interface 6. In response to the interrupt signal, the CPU 1 fetches the address from the address register 8 in the interface 6, and reads out the impedance data from the memory location specified by the address register 8. The read-out data is brought back to the maintenance panel interface 6, but at this time it is held in the data output register 10 within the interface 6. Thus, the CPU 1 operates to read out data from the location of the memory 2 specified by the address register 8 in the interface 6 and provides the data to the data output register 10. The data output register 10 is connected to the digital display device 11, on which the impedance value held in the data output register 10 is displayed. In the prior art system, as described above, the result of computation by the CPU 1, i.e., data stored in the memory 2, is read out by connecting a data display unit made up of the maintenance-panel 7 and its interface 6 to the digital relay.

Next, the setting unit in the digital relay will be described. The setting unit 5 serves to set up and hold the reference values for the discrimination between fault and not-fault depending on the result of computation by the CPU 1 in the digital relay. The setting unit 5 will be described in detail with reference to FIG. 3 showing in block diagram the relationship between the setting unit 5 and the CPU 1. The arrangement includes an operation device 13 used to enter the setting value, a data display device 14 for displaying stored setting value, a relay element selection switch 15 used to select a setting value corresponding to one of a plurality of relays, an encoder 16, a non-volatile memor 17 for storing setting values, and a multiplexer 18.

For setting a relay, the operator first specifies a relay element to be set by turning on the corresponding switch n in the relay element selection switch 15. The signal from the switch n is fed to the encoder 16, which provides the code signal of "address n" in correspondence to the switch n. In another case, if switch n+8 has been selected and it has been turned on, the encoder 16 would provide '37 address n+8". The encoder 16 further provides the relay element select signal (SEL) if any one of switches in the relay element selection switch 15 has been turned on. The SEL signal operates on the multiplexer 18, which receives the address input from the CPU 1 and another address signal from the encoder 16, to pass the address signal from the encoder 16. If, on the other hand, the SEL signal is not provided by the encoder 16, the multiplexer 18 will pass the address signal from the CPU 1. Namely, the multiplexer 18 functions to provide one of two address signals selectively depending on the presence or absence of the SEL signal. In the case of switch n in the relay element selection switch 15 being turned on, the multiplexer 18 provides the address signal from the encoder 16 to the non-volatile memory 17. Thus, address code "n" is given to the non-volatile memory 17. The non-volatile memory 17 is connected to the CPU 1 and data display device 14, and adapted to store setting values used for the computation by the CPU 1. Accordingly, on receiving "address n", the non-volatile memory 17 reads out a setting value stored in that address location, and it is displayed on the data display device 14.

In this way, when the operator turns on a relay element switch in the relay element selection switch 15, the setting value which is currently set on the data operation device 13 is read out from the non-volatile memory 17 and displayed. In order to alter the setting value, a new setting value is set on the operation device 13 connected to the non-volatile memory 17 and stored in the memory 17. After the contents of address n in the non-volatile memory 17 has been replaced with the value specified on the operation device 13, the new value is displayed on the data display device 14 so that it is confirmed by the operator. If setting values of other relay elements need to be changed, the operator operates switches n+1, n+2, n+3, and so on, in the relay element selection switch 15 sequentially and rewrites the contents of the non-volatile memory 17 at each switching operation. After all data have been stored, the CPU 1 reads out the contents of the non-volatile memory 17 this is and used for the computation.

The CPU 1 makes access to the non-volatile memory 17 in the setting unit 5 when the relay element selection switch 15 is not being operated, and the relay element selection signal SEL is absent. Accordingly, the multiplexer 18 provides the address signal supplied from the CPU 1, and the non-volatile memory 17 is addressed by the address signal supplied by the CPU 1. For the CPU 1 to read out a relay setting value, it issues the address signal, e.g., address n, corresponding to the relay element, and since the SEL signal is absent as mentioned previously, the multiplexer 18 passes the address signal from the CPU 1 to the non-volatile memory 17, which then reads out the relay setting value stored in address n. In this way, output data from the non-volatile memory 17 is given to the CPU 1, and it can read out the setting value from the non-volatile memory 17.

As described above, the setting unit 5 in the digital relay is arranged so that setting values can be set and displayed without concerning the data display unit having the maintenance panel interface 6 and maintenance panel 7. The conventional data display unit is designed so that it is connected to the digital relay when it is necessary to monitor data processed by the CPU and the like. Therefore, operationability is not good and a special care is needed when the data display unit is connected to the digital relay in operation so that the relay functions are not disturbed by the connecting operation. Provision of a fixed data display unit for the digital relay in addition to the display device in the setting unit causes redundancy, resulting disadvantageously in increased dimensions of the digital relay equipment and also increased construction cost.

SUMMARY OF THE INVENTION

It is an object of the present invention to provide a simple and yet practically useful data display system which selectively displays data processed by the central processing unit and setting values stored in the memory on the digital display unit.

The inventive data display system comprises gate means and a multiplexer which are controlled by selection switch means. The selection switch means is used to select the operating mode for displaying on the data display device data processed by the CPU or the operating mode for displaying on the data display device a setting value stored in the memory. In the setting value display mode, the operation device is used to specify the address of the setting value for the memory, and a setting value stored in the addressed location is sent through the multiplexer to the data display device. In the CPU data display mode, the gate circuit provides a numeric code for computational data as specified on the operation device to the CPU, and the computational data is sent through the multiplexer to the data display device. Accordingly, a display system with much simpler structure can be achieved as compared with the prior art system where a maintenance panel is connected to the CPU through a maintenance panel interface to display CPU data and a setting value. The data display system according to the present invention is particularly suitable for use in a digital protective relay which detects a fault in the power line system and sends the trip signal to a circuit breaker.

DESCRIPTION OF THE PREFERRED EMBODIMENTS

Figure 1:
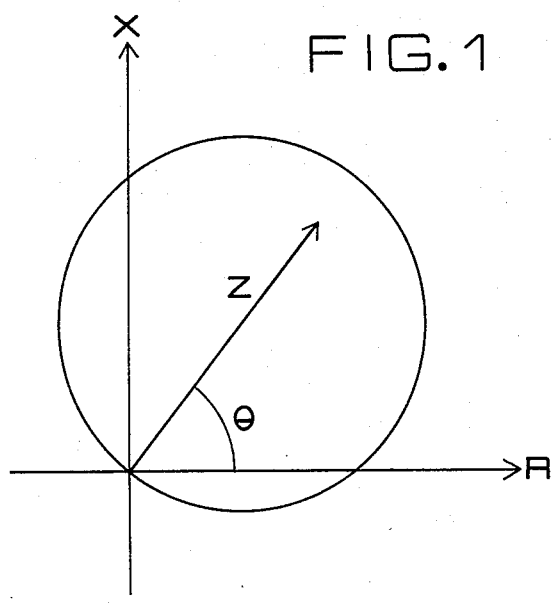
FIG. 1 is a graph showing the characteristics of a commonly used range relay for protecting the power line system.
Figure 5:
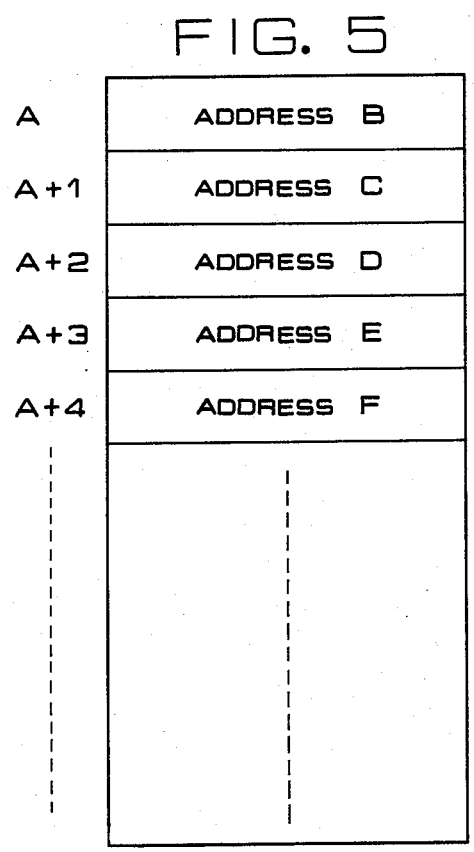
FIG. 5 is a chart used to explain the contents of the memory in the digital relay shown in FIG. 4.
Figure 2:
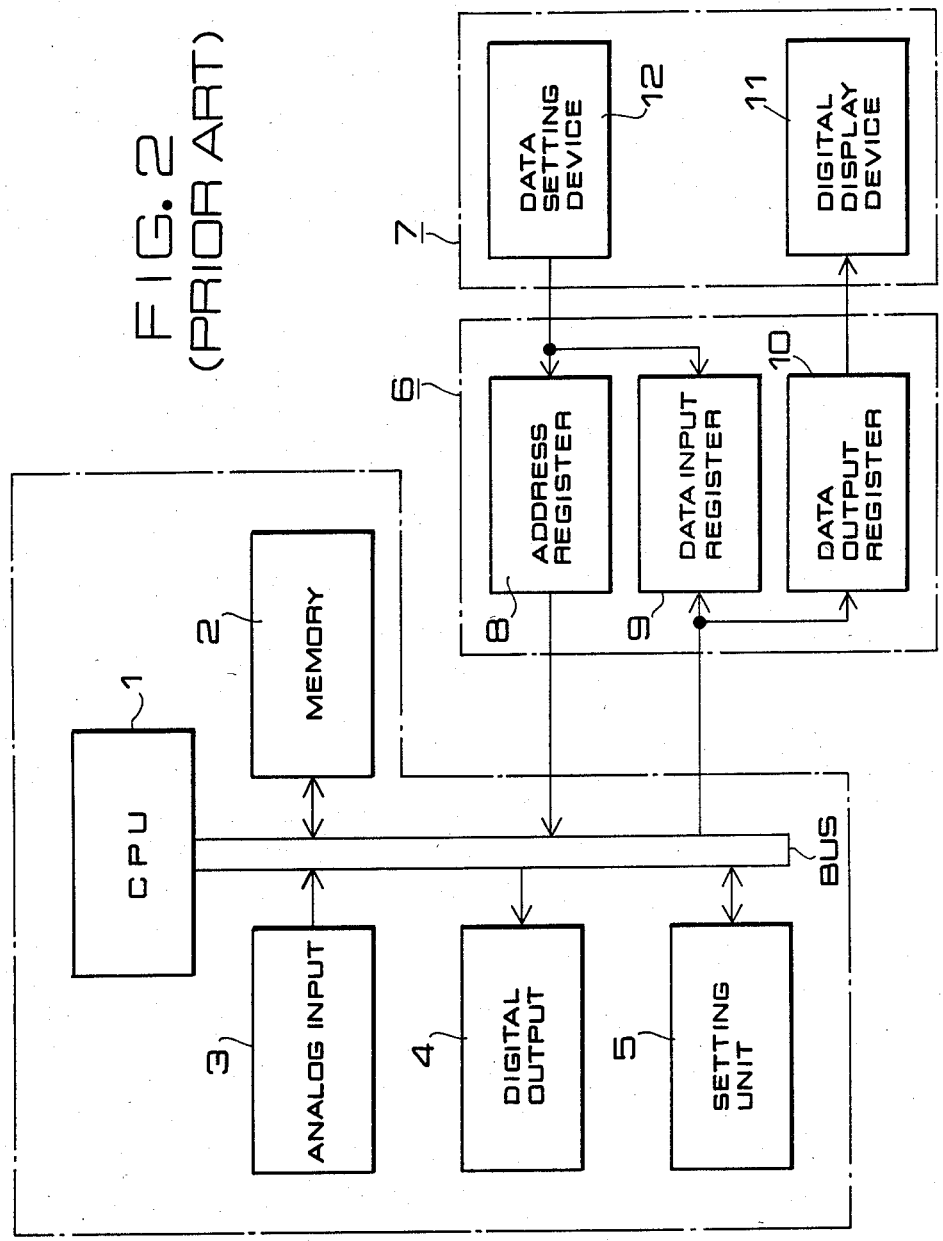
FIG. 2 is a block diagram showing the arrangement of the conventional digital relay connected with the data display unit.
Figure 3:
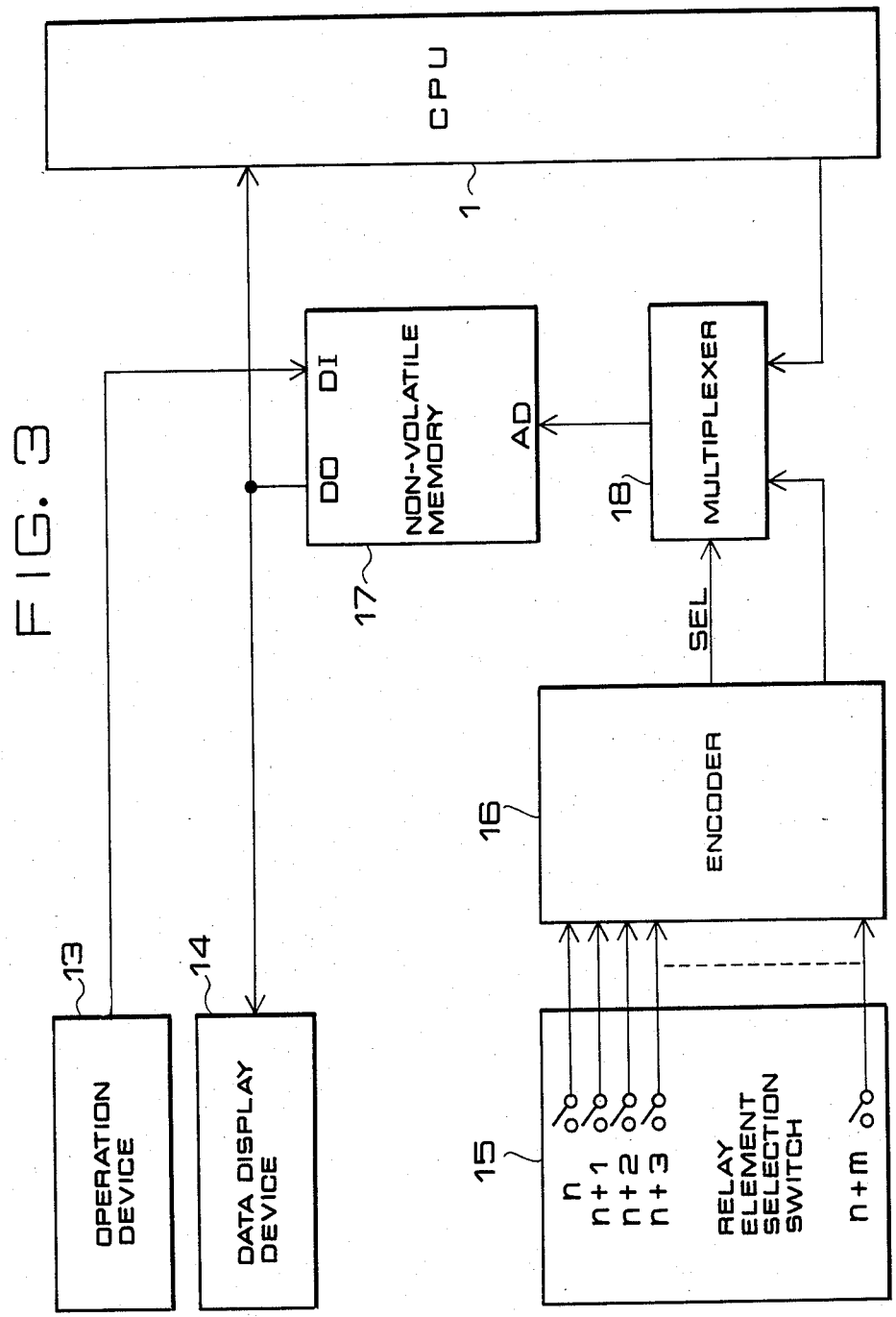
FIG. 3 is a block diagram showing the arrangement of the setting unit in the digital relay shown in FIG. 2.
Figure 4:
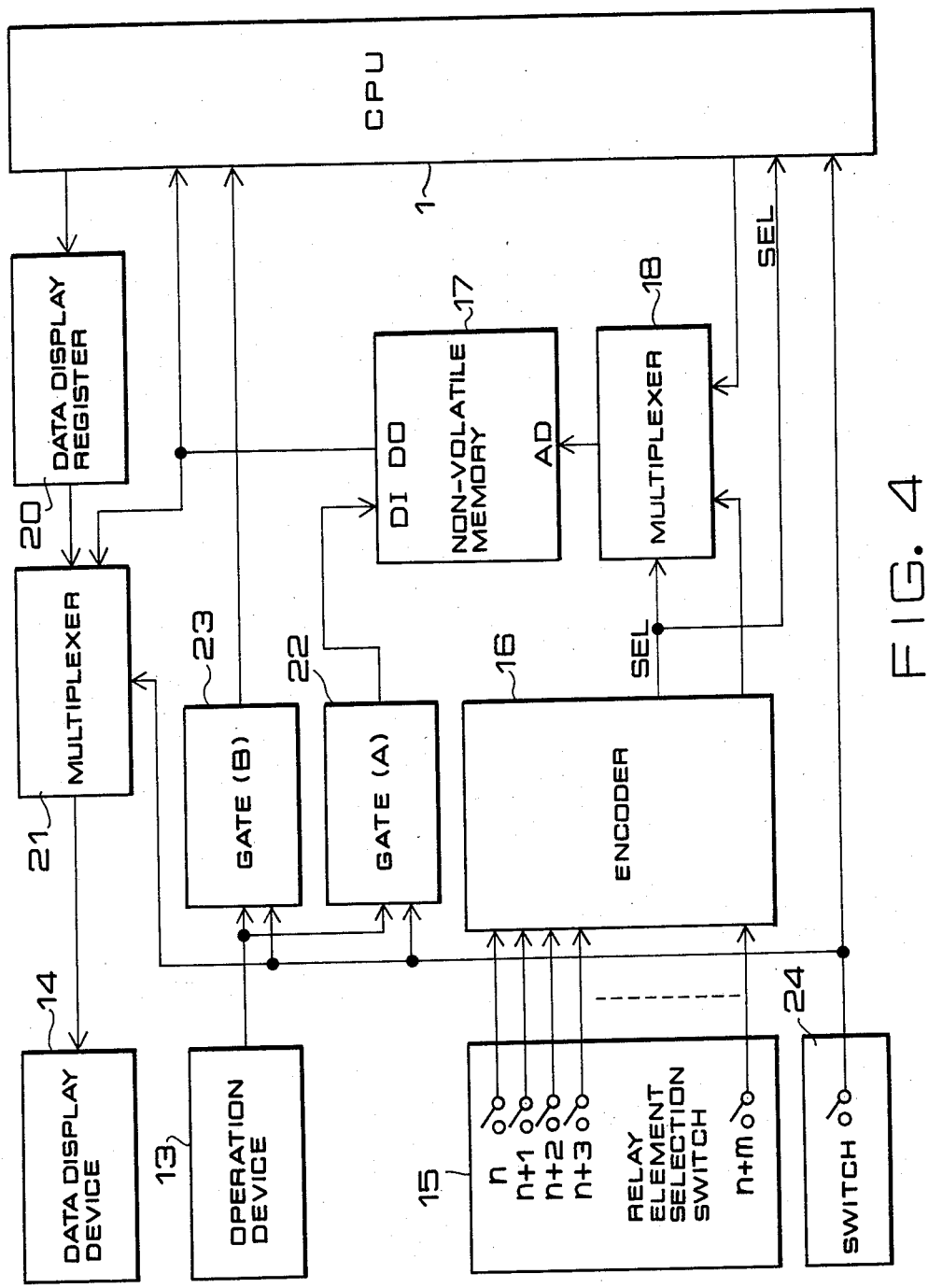
FIG. 4 is a block diagram showing the arrangement of the setting unit incorporating the data display system according to the present invention.

One embodiment of the present invention will now be described with reference to the drawings. FIG. 4 shows in block diagram the arrangement of the data display system incorporated in the setting unit 5 of the digital relay. In the figure, component blocks referred to by the symbols common to those of FIGS. 2 and 3 are identical and explanation thereof will be omitted. FIG. 5 shows the internal structure of the memory 2 in the digital relay, and is used to explain the operation for displaying data processed by the CPU 1.

In FIG. 4, reference number 20 denotes a data display register, 21 is a multiplexer which operates identically to the multiplexer 18, 22 is a gate circuit (A), 23 is a gate circuit (B), and 24 is a switch which connects the operation device 13 and data display device 14 to the CPU 1 so as to display CPU data on the data display device 14.

The operation of the embodiment will be described, first for the case of displaying a setting value stored in the non-volatile memory 17. In order to display a relay setting value, a corresponding switch n in the relay element selection switch 15 is turned on as in the case of the conventional system described previously in connection with FIG. 3. Then, the encoder 16 provides the address signal "address n" corresponding to the switch n and the SEL signal. The multiplexer 18 responds to the SEL signal to pass the "address n" from the encoder 16, instead of the address signal from the CPU 1, to the non-volatile memory 17. The SEL signal is also given to the CPU 1 so that it does not read out the contents of the non-volatile memory 17 during the active period of the SEL signal. The CPU data display switch 24 is kept in the OFF state. The signal from the switch 24 is distributed to the CPU 1, multiplexer 21, gate circuit (A) 22, and gate circuit (B) 23. With the CPU data display switch 24 set in the OFF state, the gate circuit (A) 22 is enabled and the output signal from the operation device 13 is delivered to the non-volatile memory 17. On the other hand, the gate circuit (B) 23 is disabled in response to the OFF state of the switch 24 so that the output signal from the operation unit 13 is not delivered to the CPU 1. When the CPU data display switch 24 is in the OFF state, the multiplexer 21 operates to pass data read out from the non-volatile memory 17, instead of the output from the data display resister 20, to the data display device 14.

Thus, address n is specified by the relay element selection switch 15, and setting data stored in address n of the non-volatile memory 17 is read out and displayed on the data display device 14. If the relay element selection switch 15 is switched to position "n+1", the setting value stored in address n+1 is read out and displayed on the data display device 14.

Next, the operation for rewriting the setting value in address n+1 will be described. First, the operator turns on switch n+1 in the relay element selection switch 15. The encoder 16 provides the address signal for address n+1 and the SEL signal to the multiplexer 18 as in the previous operation. Then, the SEL signal causes the multiplexer 18 to supply the output of the encoder 16 to the non-volatile memory 17 as in the case of reading out a setting value to the display device. The CPU data display switch 24 in the OFF state enables the gate circuit (A) 22 and disables the gate circuit (B) 23, and the multiplexer 21 is in the state of passing the read-out data from the non-volatile memory 17 to the data display device 14. In this state, when address n+1 is given to the non-volatile memory 17, it reads out the setting value stored in address n+1 to the data display device 14. The operator checks the present setting value on the data display device 14, and then sets a new setting value on the operation device 13. Since switch n+1 in the relay element selection switch 15 has been turned on and address n+1 for the non-volatile memory 17 has already been selected, the gate circuit (A) 22 which has been enabled by the signal from the CPU data display switch 24 conducts the output of the operation device 13 to the data input terminal (DI) of the non-volatile memory 17. Then, the new setting value is stored in the non-volatile memory 17. Assuming that data "6" has been set on the operation device 13, the binary-coded-decimal value "0110" corresponding to the set value is stored in address n+1 of the non-volatile memory 17. If alteration of the setting value of other relay elements is further needed, the operator shifts the relay element selection switch 15 from position n+1 to a desired position n+m and sets up a new setting value on the operation device 13.

On completion of setting alteration, the operator turns off all switches in the relay element selection device 15. Then, the encoder 16 quits the address output to the multiplexer 18, and the SEL signal goes off. In consequence, the multiplexer 18 is switched to conduct the address output from the CPU 1 to the non-volatile memory 17. Namely, the non-volatile memory 17 is entirely connected to the CPU 1. The CPU 1 detects the end of setting alteration by the operator by sensing the absence of the SEL signal, and checks the legality of the new setting values by the program.

Next, the most material function of the invention, that is, the operation for reading out and displaying CPU data, e.g., the value of line impedance up to the point of fault, will be described. This operation is initiated by the operator who turns on the CPU data display switch 24 in order to see the value of line impedance calculated by the digital relay. With this switch turned on, the multiplexer 21 is switched to deliver the contents of the data display register 20, instead of data read out from the non-volatile memory 17, to the data display device 14. The gate circuit (A) 22 is disabled to quit the delivery of the setup on the operation device 13 to the non-volatile memory 17, while on the other hand, the gate circuit (B) 23 is enabled to supply the setup on the operation device 13 to the CPU 1. The output of the CPU data display switch 24 is also given to the CPU 1, which responds to the ON state of the switch to fetch data from the operation device 13. In this operation, the operation switch 13 is not used to set the relay setting value, but it has been set to a predetermined numeric code corresponding to CPU data to be displayed. For example, to display the line impedance value calculated by the digital relay, a numeric code for the line impedance is set.

The operation will further be described in connection with FIG. 5. In the figure, A, A+1, A+2, A+3, A+4, and so on are numeric codes to be set on the operation device 13. The addresses, such as "address B", "address C", "address D", etc., for storing CPU data to be displayed are stored in advance in the memory 2 of the digital relay in correspondence to the codes A, A+1, A+2, A+3, A+4, and so on. The operator sets, for example, numeric code "A+1" through the operation device 13 in the setting unit 5. The CPU 1 reads the numeric code "A+1" and searches the memory 2 for data in "address C" which corresponds to the code "A+1". Then, the CPU 1 reads out the line impedance value stored in "address C" and sends it to the data display register 20. The data supplied to the data display register 20 is fed to the data display device 14 through the multiplexer 21 which conducts the signal to the display device 14 in response to the ON state of the CPU data display switch 24. This impedance data is supplied to the data display register 20 and displayed on the data display device 14 repeatedly at a fixed or arbitrary interval so long as the CPU data display switch 24 is in the ON state and the numeric code "A+1" indicating "address C" where the impedance data is stored is set on the operation device 13.

For displaying another data, the operator changes the numeric code set on the operation device 13 from "A+1" to another code, e.g., "A+3", while retaining the CPU data display switch 24 in the ON state. The CPU 1 scans the operation device 13 to read new setup code each time it supplies data to the display register 20 for display, and the CPU 1 recognizes the change of numeric code from "A+1" to "A+3" and searches the memory 2 for "address E" corresponding to the numeric code "A+3". Then, the CPU 1 reads out computational data stored in address E of the memory 2 to the data display register 20, and it is displayed on the data display device 14. For terminating data display, the operator turns off the CPU data display switch 24. The CPU quits the display operation for computational data, and returns to the process of the digital relay for detecting a fault in the power line system.

In this way, data processed by the digital relay, i.e., CPU data, can be displayed by utilization of the operation device 13 for setting the setting value and the display device 14 for displaying the setting value provided in the setting unit 5 of the digital relay, whereby the need for connecting a data display unit having a maintenance panel and its interface for monitoring computational data in the digital relay in operation is eliminated, resulting in the improved operationability. Elimination of the maintenance panel and its interface which are not necessary during the operation of the digital relay allows cost reduction of the system.

While in the above embodiment a data display system applied to the digital relay has been described, it is possible to display data for any digital equipment having a CPU and memory. Although the above embodiment has been described solely for the case of displaying the line impedance to up the point of fault calculated by the digital relay which forms a range relay, arbitrary data such as, for example, the intermediate result of computation, the breaker trip determination result, and the count of timer can be displayed. Moreover, display data may include source data such as, for example, the instantaneous values of voltage and current in the power line system.

While in the above embodiment, the data setting device in the setting unit is set indirectly through the setting of the address of the memory where the memory address for storing data to be displayed is stored, the same effect will be achieved through the direct setting on the data setting device of the address for data to be displayed. That is, any data may be set through the data setting device provided that it corresponds to data to be displayed.

In the above embodiment, data is displayed at an arbitrary interval, but instead, data may also be displayed only once at the specified moment, or data may be displayed only after it has been calculated by the digital relay. Alternatively, arrangement may be made such that a number of codes for specifying a group of data are set on the data setting device and a plurality of corresponding data are displayed sequentially and cyclically at an interval which allows satisfactory visibility for the operator, and the same effect will be achieved.

According to the present invention, as described above, the operation device for setting the setting value and the data display device for displaying setting values stored in the memory are connected to the central processing unit through the switch, so that computational data specified by the setting on the operation device is displayed on the data display device, and a data display system which allows display of computational data through the simple operation without the need for a special maintenance operation for monitoring the process of the central processing unit is accomplished.

What is claimed is:

1. A data display system for power line systems having a digital data display device for displaying selectively computational data used in a computational process carried out by a central processing unit in a digital protective relay and setting values stored in a memory for use as reference criteria in the computational process by said central processing unit, said system comprising:
　　an operation device for specifying numeric codes in correspondence to said computational data and addresses of said memory storing said setting values;
　　selection switch means for specifying one of said setting values stored in said memory;
　　gate circuit means adapted to pass the output of said operation device selectively to said central processing unit or said memory;
　　a display selection switch for controlling operation of said gate circuit means;
　　a multiplexer adapted to pass selectively one of computational data from said central processing unit or a setting value from said memory under control of said display selection switch;
　　said selection switch means comprising switches equal in number to the number of said setting values;
　　an encoder circuit which receives the outputs of said switches;
　　a second multiplexer which receives a selection signal produced by said encoder circuit in response to an ON-state of any one of said switches and, during a period of receiving the selection signal, passes only the output of said encoder circuit to said memory;

said gate circuit means comprising a first gate circuit which passes the output of said operation device to said memory when said display selection switch is set in a first state and blocks the output when said display selection switch is set in a second state, and a second gate circuit which passes the output of said operation device to said central processing unit when said display selection switch is set in the second state and blocks the output when said display selection switch is set in the first state; and a data display register connected between said central processing unit and said multiplexer;

whereby computational data specfied by the setting on the operation device is displayed on said display device to allow display of computational data without the need for a special maintenance operation to monitor the process of said central processing unit.

2. A data display system according to claim 1, wherein said digital protective relay comprises a range relay.

* * * * *

UNITED STATES PATENT AND TRADEMARK OFFICE
CERTIFICATE OF CORRECTION

PATENT NO. : 4,608,648
DATED : August 26, 1986
INVENTOR(S) : Kenji Oogaki

It is certified that error appears in the above-identified patent and that said Letters Patent is hereby corrected as shown below:

Column 1, lines 40-42, computations (1), (2) and (3) should read as follows:

$$I^2 = I^2(t) + i(t - 90°) \quad (1)$$

$$VI \cos\theta = i(t - 90°) \cdot n(t - 90°) + i(t) \cdot n(t) \quad (2)$$

$$VI \sin\theta = i(t) \cdot n(t - 90°) - i(t - 90°) \cdot n(t) \quad (3)$$

Column 2, lines 4 and 5, delete the word "meaning".

Column 3, line 27, delete " '37 ".

Signed and Sealed this

Twenty-fifth Day of November, 1986

Attest:

DONALD J. QUIGG

*Attesting Officer*      *Commissioner of Patents and Trademarks*